(12) United States Patent
Sundaram et al.

(10) Patent No.: US 10,943,943 B2
(45) Date of Patent: Mar. 9, 2021

(54) DUAL BAND GAS IMAGER

(71) Applicants: Mani Sundaram, Lexington, MA (US); Axel Reisinger, Amherst, NH (US)

(72) Inventors: Mani Sundaram, Lexington, MA (US); Axel Reisinger, Amherst, NH (US)

( * ) Notice: Subject to any disclaimer, the term of this patent is extended or adjusted under 35 U.S.C. 154(b) by 0 days.

(21) Appl. No.: 16/441,581

(22) Filed: Jun. 14, 2019

(65) Prior Publication Data
US 2020/0328246 A1 Oct. 15, 2020

Related U.S. Application Data

(60) Provisional application No. 62/685,087, filed on Jun. 14, 2018.

(51) Int. Cl.
*H01L 27/146* (2006.01)
*H04N 5/33* (2006.01)
*G01J 5/00* (2006.01)
*G01N 21/35* (2014.01)
*G01N 21/3504* (2014.01)

(52) U.S. Cl.
CPC ...... *H01L 27/14649* (2013.01); *G01J 5/0014* (2013.01); *G01N 21/3504* (2013.01); *H04N 5/33* (2013.01); *G01J 2005/0077* (2013.01)

(58) Field of Classification Search
CPC ............ G01J 5/0014; G01J 2005/0077; G01N 21/3504; H01L 27/14649; H04N 5/33
See application file for complete search history.

(56) References Cited

U.S. PATENT DOCUMENTS

| 8,193,496 | B2 | 6/2012 | Furry |
| 8,274,096 | B2 | 9/2012 | Wicks |
| 8,426,813 | B2 | 4/2013 | Furry |
| 9,024,296 | B2 | 5/2015 | Sundaram et al. |

FOREIGN PATENT DOCUMENTS

WO WO-2016188555 A1 * 12/2016 ............... G01J 5/10

OTHER PUBLICATIONS

Passive Infrared Sysyems for Remote Chemical Detection Assessment Report, Homeland Security Science and Technology, Prepared by National Security Technologies, LLC, Sep. 2016, 57 pages.

* cited by examiner

*Primary Examiner* — Mark R Gaworecki
(74) *Attorney, Agent, or Firm* — Maine Cernota & Rardin

(57) ABSTRACT

A semiconductor gas imaging device system and method includes one chip dual band Type II Superlattice (T2SL) detectors comprising two back to back diodes wherein the bias is flipped. Embodiment voltages are +1V to −1V. For embodiments, only the detector with negative voltage detects incoming infrared radiation.

20 Claims, 8 Drawing Sheets

OVERVIEW

PASSIVE IR SENSING ENVIRONMENT

OVERVIEW

GAS AND REFERENCE BANDS

BAND EDGES

2 MICRON TO 3,2 MICRON QE DETAIL

BAND OVERLAPS

700

3.4 μm          3.6 μm

BAND OVERLAP DETAIL

800

10.6 μm 10.6 MICRON BAND

DUAL BAND GAS IMAGER

RELATED APPLICATIONS

This application claims the benefit of U.S. Provisional Application No. 62/685,087, filed Jun. 14, 2018. This application is herein incorporated by reference in its entirety for all purposes.

FIELD OF THE INVENTION

The invention relates to gas imaging sensors, and more particularly, to an infrared dual band gas imaging device, method, and system.

BACKGROUND OF THE INVENTION

InfraRed Remote Chemical Detection (IR-RCD) devices use spectral signatures to remotely detect, identify, and characterize chemicals in the gas or vapor phase. Chemicals absorb light in different narrow spectral bands in a unique manner creating a spectrum that can be used to indicate the presence of one or many chemicals, uniquely identify the chemical(s), and quantify concentrations. Depending on the design, an IR-RCD may uniquely identify a chemical and provide an accurate measurement of concentration, or may only identify a chemical family and provide a relative concentration. Factors that influence the degree to which a chemical can be identified and quantified include the resolution of the instrument, the region of the spectrum measured, and spectral features of the target chemical. Passive IR-RCDs measure IR light absorbed by or emitted from a gas.

Scenario environments for IR-RCD may include some or all of: determination that an event was an improvised chemical device (ICD); survey an area to find bodies using decomposing gases; provide event security—perimeter monitoring; arson investigation—find accelerants; identify chemical threats before entering area; firefighting; industrial release; transportation accident tank car derailment; compliance monitoring (environmental compliance); industrial monitoring; agricultural chemical monitoring and characterization; leak detection or location; vapor intrusion into buildings; odor investigation; post-disaster surveys; plume tracking; oil spill or other large release characterization and monitoring; detect and/or characterize chemical suicide sites; detect covert drug production labs; natural gas leaks; detect and identify Chemical Warfare Agents (CWA) releases; and provide chemical warfare and TIC decontamination surveillance.

Difficulties in imaging gasses in the infrared include the need for filters. These have been required to distinguish the gas absorption bands from the background spectrum. Filter implementations include 1) a cold filter, 2) a warm filter, and 3) a warm filter combined with a cold filter. A particular challenge is to reduce false alarms. For example, a gust of air that is particularly cold can be mistaken for a particular gas. Likewise, the shadow of a bush, as seen by a camera from a moving platform like a plane or a drone, can be mistaken for a gas plume. Such false alarms can be addressed by imaging in two spectral bands: a "gas" band in which the gas absorbs light, and a reference band in which it absorbs sufficiently less light. Comparing the video from the two bands will allow one to determine that a change that occurs predominantly in the gas band and less so in the reference band has to be very likely due to the presence of the gas. False alarms like cold gusts of air, or shadows, will be present in both bands and can therefore be weeded out by image processing schemes like simple ratio-ing. To collect video in the two bands, a camera can be equipped with a warm filter wheel equipped with two filters, one for each band. The wheel is rotated and video is collected sequentially in the two bands. For better signal-to-noise, this approach can be combined with a cold filter that transmits light in only the two spectral bands of interest: by rejecting all light out of both bands and not emitting any radiation itself by virtue of its low temperature, such a cold filter improves signal-to-noise and allows smaller gas concentrations to be seen. Another method is to use a special filter, consisting of a pattern of the two filters, in close proximity to the focal plane array or directly on it. Such a pattern could be alternating stripes of the two filters or a checkerboard pattern of the two filters. Since the scene is being imaged in one set of pixels in the gas band and a different set of pixels in the reference band in this approach, pixel resolution is lost. As long as the pixels are small enough, this approach may still work to reduce false alarms. But patterned filters are very difficult and expensive to make.

U.S. Patents describing infrared imagers for gas detection include U.S. Pat. Nos. 8,193,496 and 8,426,813. Applicant's U.S. Pat. No. 9,024,296 describes a Focal Plane Array with Pixels Defined by Modulation of Surface Fermi Energy. All references, including publications, patent applications, and patents, cited herein are hereby incorporated by reference in their entireties for all purposes to the same extent as if each reference were individually and specifically indicated to be incorporated by reference and were set forth in their entireties herein.

What is needed is an infrared imaging gas detection device, system, and method with reduced false alarms and improved Size Weight and Power (SWaP) characteristics compared to current, filter-implemented, gas imagers.

SUMMARY OF THE INVENTION

An embodiment provides a method comprising at least one chip comprising at least one dual band Type II Superlattice (T2SL) detector comprising two back to back diodes, each detecting in a different spectral band, wherein a bias is flipped from one frame to a next frame; the spectral band comprises a gas band and a reference band; wherein the detected IR radiation in the gas band and the detected IR radiation in the reference band are compared, whereby the gases are detected. In embodiments the bias flip comprises a flip between −1V and +1V. Other embodiments comprise a gas band1 of 0-3.4 microns whereby hydrocarbons are detected due to a photon flux drop with wavelength. Subsequent embodiments comprise a reference band of 3.4 to 3.6 microns. Additional embodiments comprise a target detection hydrocarbon gas line of 3.2-3.4 microns. Another embodiment comprises a band1 of 0-3.4 microns and a band2 of 3.4 to 3.6 microns wherein no cold filter is included. A following embodiment comprises a gas band1' of 0-4 microns and a reference band2' of 4-5 microns. Further embodiments comprise a first cold filter of 3.2-3.4 microns for hydrocarbons in band1', and a second cold filter of 4.2-4.3 microns in band2'. Additional embodiments comprise a single cold filter having two passbands of 3.2-3.4 microns and 4.2 to 4.3 microns. Included embodiments comprise warm filter wheels at 3.4 microns and 3.6 microns. Yet further embodiments comprise a gas detection band centered at about 10.6 microns is configured for $SF_6$, $NH_3$, and $CO_2$ gas detection. Related embodiments comprise a reference band1' of 0-9 microns and a gas band2" of 9-11 microns. Still further embodiments comprise a reference band1" cold filter from 8.5 to 8.6 microns, and a gas band2" cold filter from 10.5 to 10.7 microns. Ensuing embodiments comprise a single cold filter having two passbands of 8.5 to 8.6 microns and 10.5 to 10.7 microns.

Another embodiment provides a method for infrared (IR) dual band gas imaging comprising providing at least one semiconductor chip comprising at least one dual band Type II Superlattice (T2SL) detector comprising two back to back diodes, each detecting in a different spectral band, wherein a bias is flipped from one frame to a next frame, wherein the spectral band comprises a gas band and a reference band; detecting IR radiation in the gas band; detecting IR radiation in the reference band, wherein the gas band and the reference band are different wavelengths; and comparing the detected IR radiation in the gas band; and the detected IR radiation in the reference band, whereby the gases are detected. For yet further embodiments, only detectors with negative voltages detect incoming infrared radiation. For more embodiments, video frames are displayed at 30 to 100 Hz. Continued embodiments include a Focal Plane Array (FPA) switches its spectral response between the two bands alternately by switching a voltage applied across all pixels, thereby producing sequential imaging in the two bands, wherein a frame rate is much faster than typical gas plumes, the sequential dual band imaging thereby reducing false alarms. For additional embodiments, a Focal Plane Array (FPA) produces two video images simultaneously.

A yet further embodiment provides a system for infrared (IR) dual band gas imaging comprising a Focal Plane Array (FPA) comprising at least one dual band Type II Superlattice (T2SL) detector comprising two back to back diodes, each detecting in a different spectral band, wherein a bias is flipped from one frame to a next frame; wherein the spectral band comprises a gas band and a reference band; wherein the bias flip comprises a flip between −1V and +1V; and video frames are displayed at 60 frames per second wherein the detected IR radiation in the gas band; and the detected IR radiation in the reference band are compared, whereby the gases are detected.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter. The invention is susceptible of many embodiments. What follows is illustrative, but not exhaustive, of the scope of the invention.

DETAILED DESCRIPTION

Figure 1:
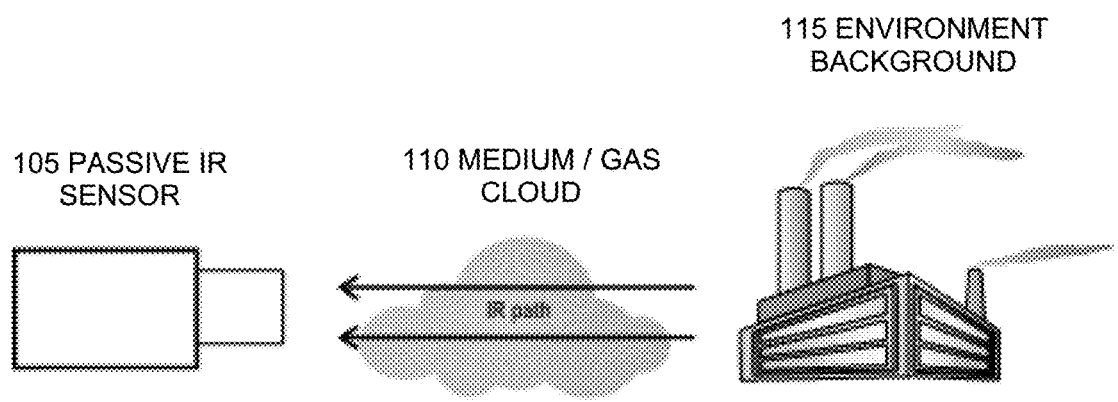
FIG. 1 depicts a simplified environment for a dual band gas imager configured in accordance with one embodiment of the invention.

FIG. 1 depicts a simplified environment 100 for a dual band gas imager. Passive infrared sensor 105 views medium/gas cloud 110 in front of scene background 115.

In contrast to the known devices, device embodiments image in the two bands by using a special "dualband" focal plane array which images in the gas band and in the reference band. In one embodiment, the FPA produces two videos simultaneously, one for each band, with full pixel resolution. In a simpler embodiment, the FPA switches its spectral response between the two bands alternately by switching the voltage applied across all the pixels. This produces sequential imaging in the two bands, because frame rates are typically 30-100 Hz, much faster than typical gas plumes, sequential dualband imaging works well to reduce false alarms.

Embodiments comprise one chip (single detector or detector array or imaging focal plane array which comprises a detector array attached to a readout multiplexer) dual band Type II Superlattice (T2SL) detectors comprising two back to back diodes, each detecting in a different spectral band called band1 and band2, wherein the bias is flipped from one frame to the next. Embodiment voltages are +1V to −1V. For embodiments, only the detector with negative voltage detects incoming infrared radiation. As the voltage is flipped, the detector with negative bias is alternated and the spectral band detected and imaged is alternated between band1 and band2. Embodiments operate at 60 frames per second. Embodiments must have two bands, band1 and band2, that cover the desired gas band and reference band. The gas band is a portion or all of band1 and the reference band is a portion or all of band2. Embodiments employ no warm filter wheel.

Figure 2:
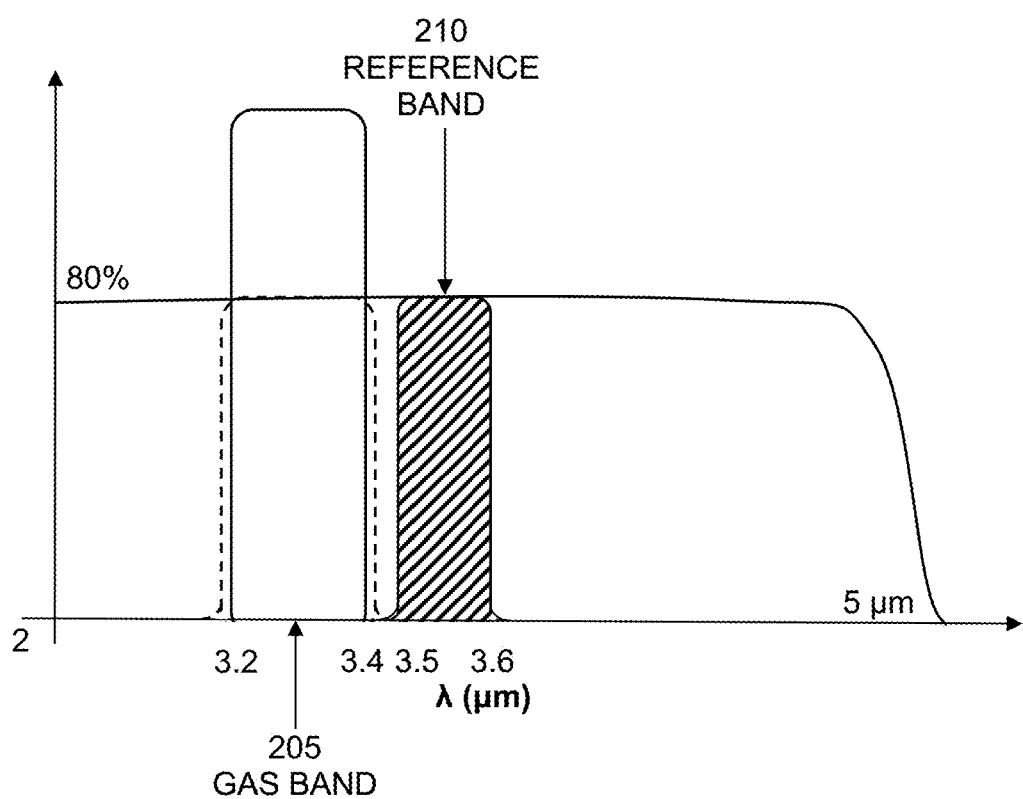
FIG. 2 is a composite portrayal of an overview of technical characteristics of a dual band gas imager configured in accordance with embodiments of the invention.

FIG. 2 is a composite portrayal 200 of an overview of technical characteristics of a dual band gas imager depicting Quantum Energy (QE) for gas band 205 and reference band 210.

Figure 3:
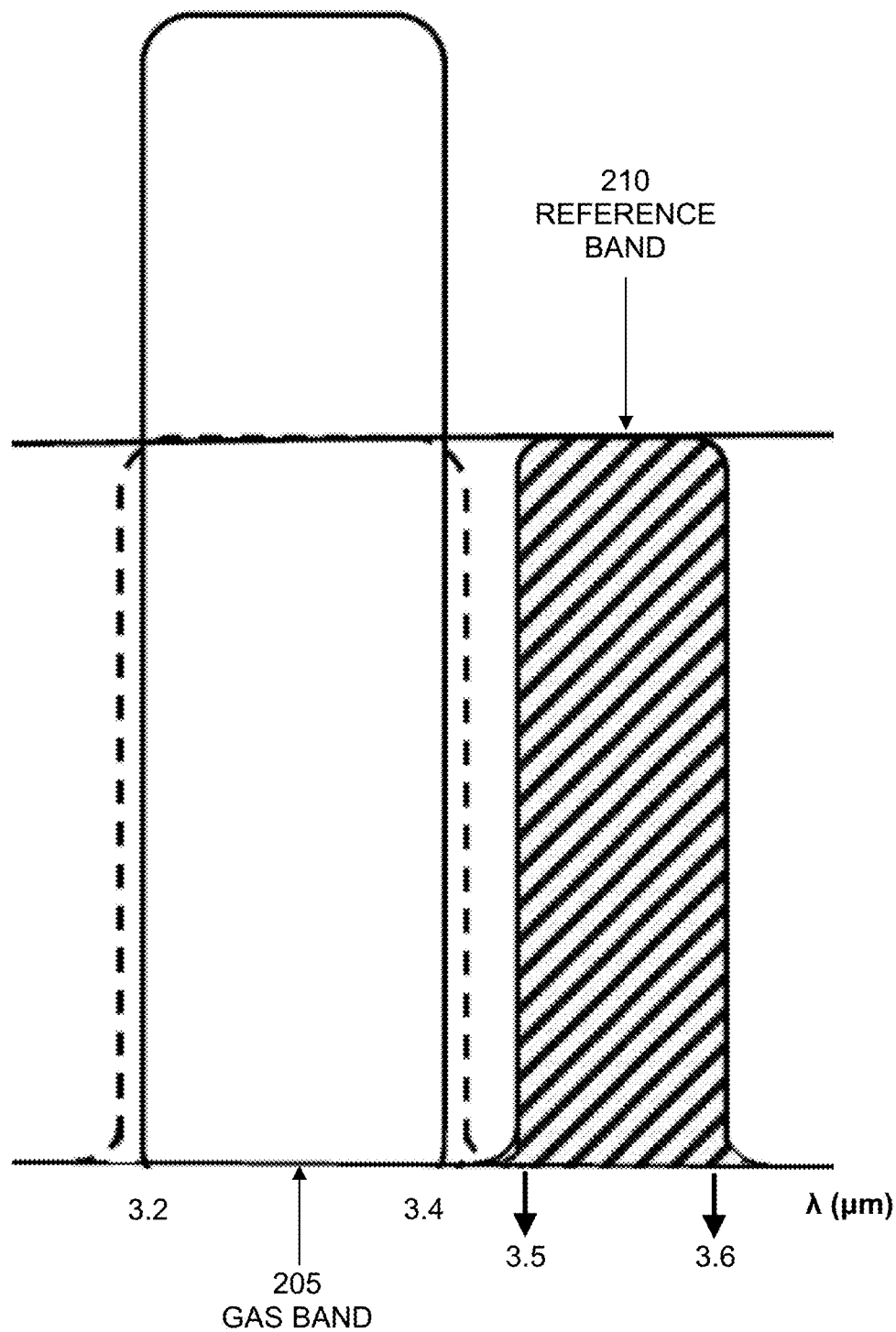
FIG. 3 is a detail of gas and reference bands of the composite portrayal of technical characteristics of a dual band gas imager configured in accordance with embodiments of the invention.

FIG. 3 is a detail 300 of gas band 205 and reference band 210 of the composite portrayal of technical characteristics of a dual band gas imager.

Figure 4:
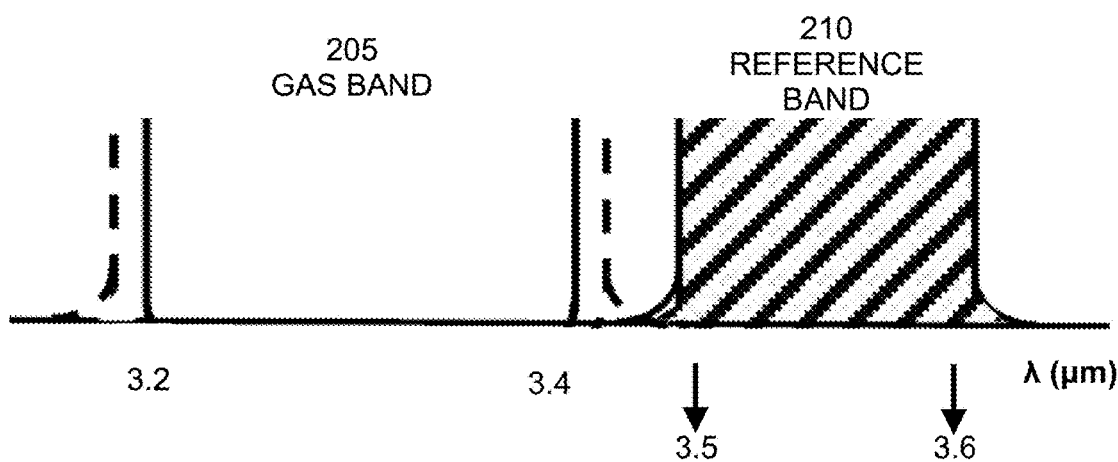
FIG. 4 is a detail of band edges of the composite portrayal of technical characteristics of a dual band gas imager configured in accordance with embodiments of the invention.

FIG. 4 is a detail 400 of band edges of the composite portrayal of technical characteristics of a dual band gas imager.

Figure 5:
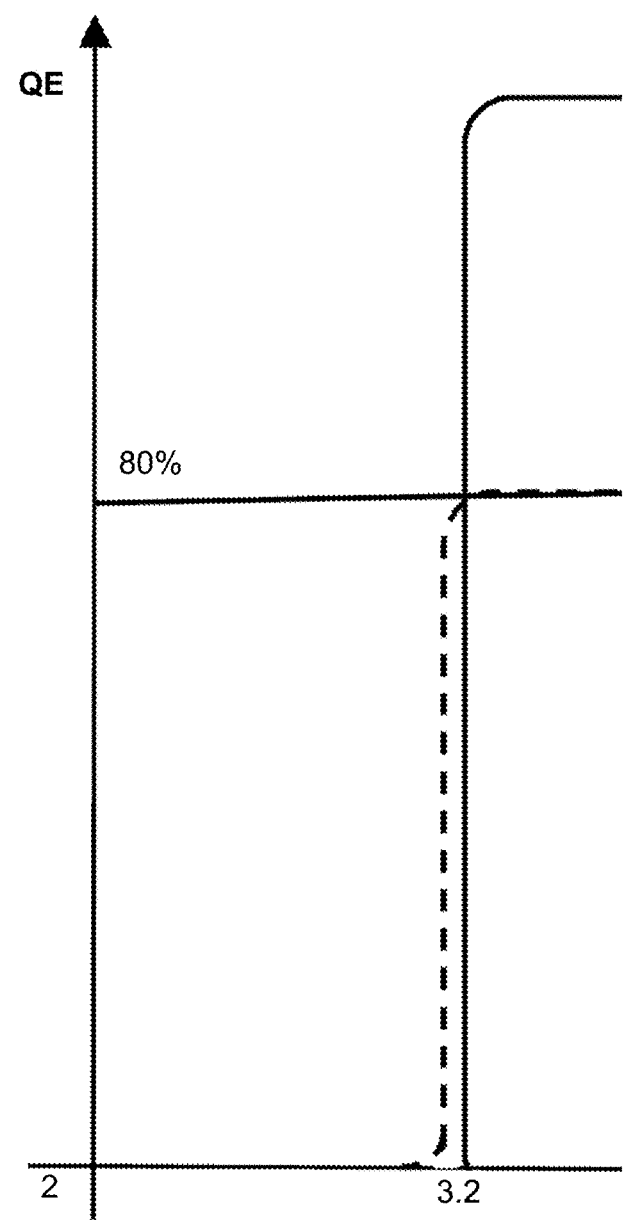
FIG. 5 is a detail of 2 μm to 3.2 μm QE detail of the composite portrayal of technical characteristics of a dual band gas imager configured in accordance with embodiments of the invention.

FIG. 5 is a detail 500 of 2 μm to 3.2 μm QE details of the composite portrayal of technical characteristics of a dual band gas imager.

Figure 6:
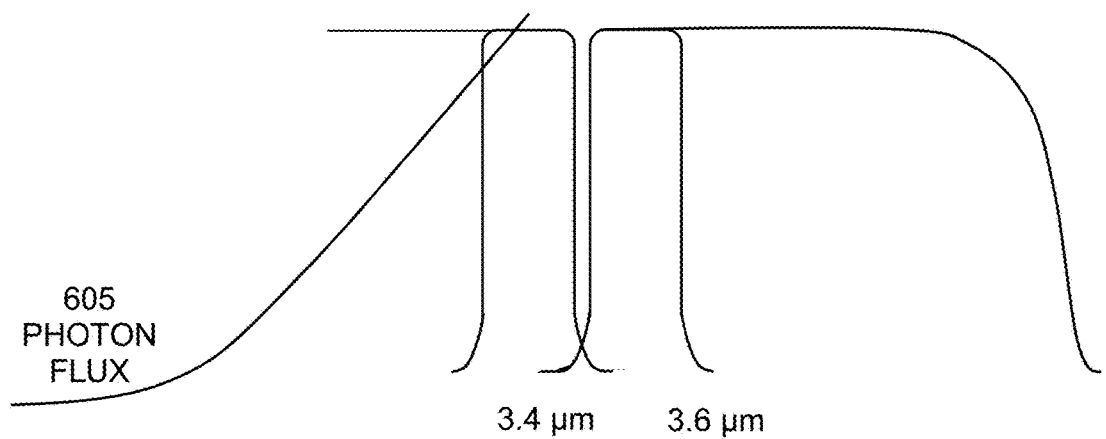
FIG. 6 is a detail of band overlaps of the composite portrayal of technical characteristics of a dual band gas imager configured in accordance with embodiments of the invention.

FIG. 6 is a detail 600 of band overlaps and photon flux 605 of a dual band gas imager.

Figure 7:
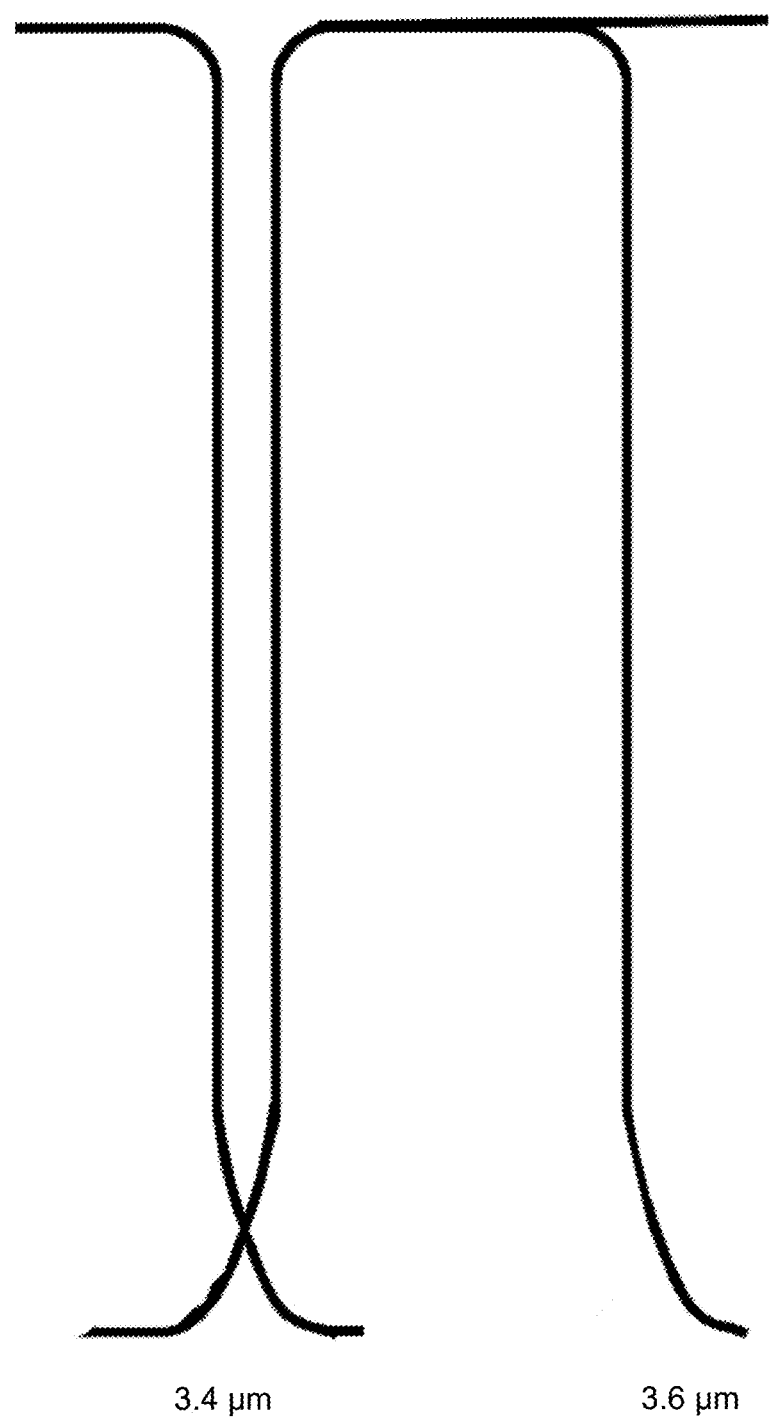
FIG. 7 is a detail of band overlap details of the composite portrayal of technical characteristics of a dual band gas imager configured in accordance with embodiments of the invention.

FIG. 7 is a detail 700 of band overlap details of a dual band gas imager.

Figure 8:
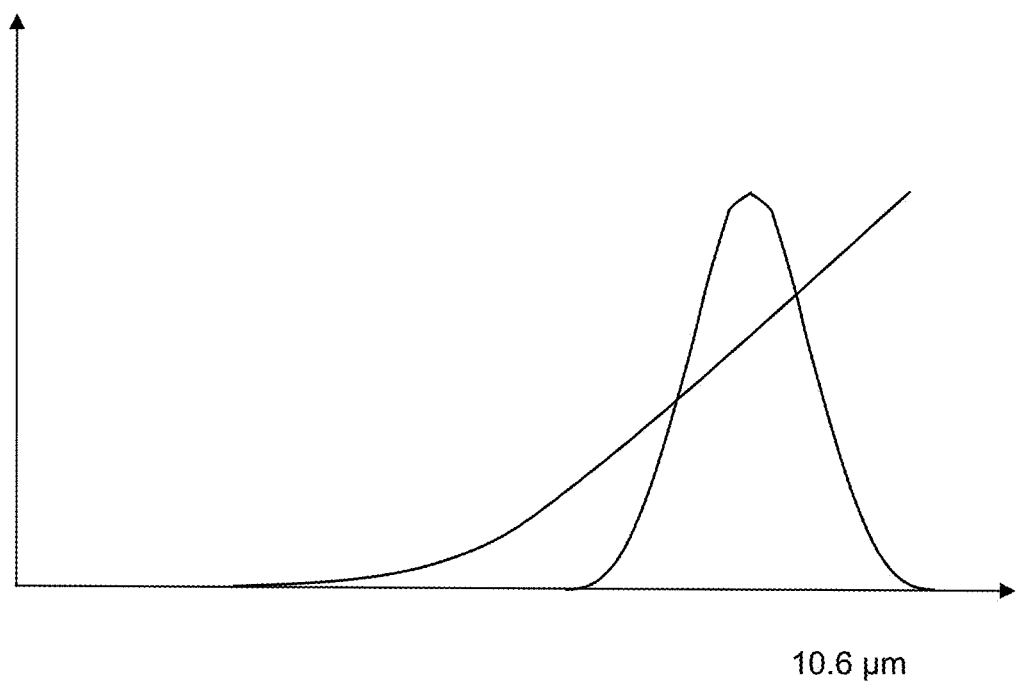
FIG. 8 depicts a 10.6 μm gas band of a dual band gas imager configured in accordance with embodiments of the invention.

FIG. 8 depicts a 10.6 μm gas band 800 representative of $SF_6$, $NH_3$, and $CO_2$ gasses for a dual band gas imager, including a photon flux depiction.

Embodiments comprise a cut off for hydrocarbons. Detector embodiment cut offs are, for example, at 3.4 microns and 3.6 microns (FIG. 2, FIG. 3). At one voltage, the detector detects light in band1 from 0-3.4 microns (FIG. 6); at the other voltage, the detector detects light in band2 from 3.4 to 3.6 microns (FIG. 7). The hydrocarbon gas band is 3.2-3.4 microns (FIG. 6). But hydrocarbon absorption can be detected in all of the band1 from 0-3.4 microns because photon flux on earth drops off exponentially with decreasing wavelength (FIG. 6). For this combination of band1 and band2, no cold filters are necessary. Embodiments can comprise wide band detectors in combination with one or more cold filters. For example, band1 of the dualband detector can be from 0-4 microns, and band2 can be from 4-5 microns. The hydrocarbon gas band can then be defined inside band1 with a cold filter from 3.2-3.4 microns. The reference band can be defined inside band2 with a second cold filter from 4.2-4.3 microns. The two cold filters can be combined into a single cold filter with two pass-bands from 3.2-3.4 and 4.2-4.3 microns, respectively.

Embodiments of gas imaging chips have a gas band centered at approximately 10.6 microns (FIG. 8). Detected substances in this band can include SF6, NH3, and CO2. In a dualband detector or focal plane array, band1 can be from 0-9 microns, for example, and band2 can be from 9-11 microns. The gas band will then be defined inside band2 with a cold filter from 10.5-10.7 microns for example, and a reference band inside band1 with a cold filter from 8-5-8.6 microns for example. Both cold filters can be combined into one cold filter with a double bandpass.

The foregoing description of the embodiments of the invention has been presented for the purposes of illustration and description. It is not intended to be exhaustive or to limit the invention to the precise form disclosed. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

What is claimed is:

1. A semiconductor infrared (IR) dual band gas imaging device, system, and method comprising:
    at least one chip comprising at least one dual band Type II Superlattice (T2SL) detector comprising two back to back diodes, each detecting in a different spectral band, wherein a bias of said T2SL detector is flipped from one frame to a next frame;
    said dual band comprises a gas band and a reference band;
    wherein detected IR radiation in said gas band and said detected IR radiation in said reference band are compared, whereby said gases are detected.

2. The device of claim 1, wherein said bias flip comprises a flip between −1V and +1V.

3. The device of claim 1, comprising a gas band1 of 0-3.4 microns whereby hydrocarbons are detected due to a photon flux drop with wavelength.

4. The device of claim 1, comprising a reference band of 3.4 to 3.6 microns.

5. The device of claim 1, comprising a gas band target detection hydrocarbon gas line of 3.2-3.4 microns.

6. The device of claim 1, comprising a gas band1 of 0-3.4 microns and a reference band2 of 3.4 to 3.6 microns wherein no cold filter is included.

7. The device of claim 1, comprising a gas band1' of 0-4 microns and a reference band2' of 4-5 microns.

8. The device of claim 1, comprising a first cold filter of 3.2-3.4 microns for hydrocarbons in a gas band1', and a second cold filter of 4.2-4.3 microns in a reference band2'.

9. The device of claim 1, comprising a single cold filter having two passbands of 3.2-3.4 microns and 4.2 to 4.3 microns.

10. The device of claim 1, comprising warm filter wheels having passbands at 3.4 microns and 3.6 microns.

11. The device of claim 1, wherein said gas band is centered at about 10.6 microns whereby said device is configured for $SF_6$, $NH_3$, and $CO_2$ gas detection.

12. The device of claim 1, comprising a reference band1" of 0-9 microns and a gas band2" of 9-11 microns.

13. The device of claim 1, comprising a reference band1" cold filter passband from 8.5 to 8.6 microns, and a gas band2" cold filter passband from 10.5 to 10.7 microns.

14. The device of claim 1, comprising a single cold filter having two passbands of 8.5 to 8.6 and 10.5 to 10.7 microns.

15. A method for infrared (IR) dual band gas imaging comprising:
    providing at least one semiconductor chip comprising at least one dual band Type II Superlattice (T2SL) detector comprising two back to back diodes, each detecting in a different spectral band, wherein a bias of said T2SL detector is flipped from one frame to a next frame, wherein said dual band comprises a gas band and a reference band;
    detecting IR radiation in said gas band;
    detecting IR radiation in said reference band, wherein said gas band and said reference band are different wavelengths; and
    comparing said detected IR radiation in said gas band; and said detected IR radiation in said reference band, whereby said gases are detected.

16. The method of claim 15, wherein only detectors with negative voltages detect incoming infrared radiation.

17. The method of claim 15, wherein video frames are displayed at 30 to 100 Hz.

18. The method of claim 15, wherein a Focal Plane Array (FPA) switches its spectral response between said two bands alternately by switching a voltage applied across all pixels, thereby producing sequential imaging in said two bands, said sequential dual band imaging reducing false alarms.

19. The method of claim 15, wherein a Focal Plane Array (FPA) produces two video images simultaneously.

20. A system for infrared (IR) dual band gas imaging comprising:
    a Focal Plane Array (FPA) comprising at least one dual band Type II Superlattice (T2SL) detector comprising two back to back diodes, each detecting in a different spectral band, wherein a bias of said T2SL detector is flipped from one frame to a next frame;
    wherein said dual spectral band comprises a gas band and a reference band;
    wherein said bias flip comprises a flip between −1V and +1V; and
    video frames are displayed at 60 frames per second;

wherein detected IR radiation in said gas band; and detected IR radiation in said reference band are compared, whereby said gases are detected.

\* \* \* \* \*